United States Patent
Lee

(10) Patent No.: US 10,361,722 B2
(45) Date of Patent: Jul. 23, 2019

(54) SEMICONDUCTOR MEMORY DEVICE PERFORMING RANDOMIZATION OPERATION

(71) Applicant: SK hynix Inc., Gyeonggi-do (KR)

(72) Inventor: Wan Seob Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 102 days.

(21) Appl. No.: 15/596,803

(22) Filed: May 16, 2017

(65) Prior Publication Data

US 2018/0131390 A1   May 10, 2018

(30) Foreign Application Priority Data

Nov. 10, 2016   (KR) .................. 10-2016-0149522

(51) Int. Cl.
```
H03M 13/11      (2006.01)
H03M 13/00      (2006.01)
G06F 11/10      (2006.01)
```

(52) U.S. Cl.
CPC ..... *H03M 13/1108* (2013.01); *G06F 11/1012* (2013.01); *H03M 13/611* (2013.01)

(58) Field of Classification Search
CPC .................. H03M 13/1108; H03M 13/611
See application file for complete search history.

(56) References Cited

U.S. PATENT DOCUMENTS

| | | | |
|---|---|---|---|
| 8,879,336 B2* | 11/2014 | Kim | G11C 7/02 365/189.05 |
| 9,324,450 B2 | 4/2016 | Jigour et al. | |
| 9,367,392 B2 | 6/2016 | Michael | |
| 2010/0259983 A1* | 10/2010 | Yoon | G11C 11/5628 365/185.12 |
| 2012/0221775 A1* | 8/2012 | Kim | G06F 21/00 711/103 |
| 2013/0013854 A1* | 1/2013 | Mun | G11C 16/0483 711/103 |
| 2013/0117620 A1* | 5/2013 | Joo | G11C 16/10 714/746 |
| 2014/0169092 A1* | 6/2014 | Miyamoto | G11C 16/26 365/185.09 |
| 2016/0293253 A1* | 10/2016 | Ogiwara | G11C 13/004 |
| 2017/0269998 A1* | 9/2017 | Sunwoo | G06F 11/1044 |
| 2017/0329667 A1* | 11/2017 | Hirano | H03M 13/152 |
| 2018/0024744 A1* | 1/2018 | Kim | G06F 3/0604 711/103 |
| 2018/0143876 A1* | 5/2018 | Yang | G06F 11/1068 |
| 2018/0143877 A1* | 5/2018 | Yang | G11C 11/5628 |

FOREIGN PATENT DOCUMENTS

KR   1020150001612   1/2015

* cited by examiner

*Primary Examiner* — Kyle Vallecillo
(74) *Attorney, Agent, or Firm* — IP & T Group LLP

(57) ABSTRACT

Provided herein is a semiconductor memory device. The semiconductor memory device may include a plurality of planes including a plurality of memory cells, read/write circuits coupled to the plurality of planes, respectively, and temporarily storing normal data inputted from an external device, random data, and parity data, and an error correction circuit generating the random data by randomizing the normal data, generating parity data for the random data during a program operation, correcting an error of the random data by using the parity data and de-randomizing the random data during a read operation.

25 Claims, 12 Drawing Sheets

SEMICONDUCTOR MEMORY DEVICE PERFORMING RANDOMIZATION OPERATION

CROSS-REFERENCE TO RELATED APPLICATION

The present application claims priority under 35 U.S.C. § 119(a) to Korean patent application number 10-2016-0149522 filed on Nov. 10, 2016, which is herein incorporated by reference in its entirety.

BACKGROUND

Field of Invention

Various embodiments of present invention relate generally to a semiconductor memory device performing a randomization operation and, more particularly, to a semiconductor memory device including a page buffer for temporarily storing parity data.

Description of Related Art

A memory system includes a semiconductor memory device for storing data and a memory controller for controlling transmission of a command, an address, and data between the semiconductor memory device and a host.

Semiconductor memory devices are classified into volatile memory devices or non-volatile memory devices.

The host may communicate with a semiconductor memory device using an interface protocol such as a peripheral component interconnect-express (PCI-E), an advanced technology attachment (ATA), a serial ATA (SATA), a parallel ATA (PATA), and the like. The interface protocols between the host and the semiconductor memory device are not limited to the above-described examples, but may include other various protocols such as a universal serial bus (USB), a multi-media card (MMC), an enhanced small disk interface (ESDI), or integrated drive electronics (IDE).

SUMMARY

Various embodiments of the present invention are directed to a semiconductor memory device capable of reducing a size thereof by temporarily storing parity data used for an error correction operation, in page buffers during a program operation or a read operation.

One embodiment of the present invention provides a semiconductor memory device including a plurality of planes including a plurality of memory cells, read/write circuits coupled to the plurality of planes, respectively, and temporarily storing normal data inputted from an external device, random data, and parity data, and an error correction circuit generating the random data by randomizing the normal data, generating parity data for the random data during a program operation, correcting an error of the random data by using the parity data and de-randomizing the random data during a read operation.

According to an embodiment, a semiconductor memory device may include a plurality of memory blocks including a plurality of memory cells, a page buffer group coupled to the plurality of memory blocks through bit lines and temporarily storing first data, second data randomized from the first data, or parity data, a first column selection decoder sequentially transmitting the first data, the second data, or the parity data stored in the page buffer group to a first global data line, a second column selection decoder sequentially inputting the first data, the second data, or the parity data loaded on a second global data line to the page buffer group, and an error correction circuit coupled to the page buffer group through the first and second global data lines, randomizing the first data to convert the first data into the second data, generating the parity data, correcting an error of the second data by using the parity data, and de-randomizing the second data to convert the second data into the first data.

According to an embodiment, a semiconductor memory device may include a plurality of planes including a plurality of memory blocks, page buffer groups coupled to the plurality of planes, respectively, and temporarily storing first data, second data randomized from the first data, or parity data used for an error correction operation, column selection decoders sequentially transmitting the first data, the second data or the parity data stored in the page buffer groups to global data lines, or sequentially transmitting data loaded on the global data lines to the page buffer groups, an error correction circuit coupled to the page buffer groups through the global data lines, randomizing the first data to convert the first data into the second data, generating the parity data for the second data, performing the error correction operation, and de-randomizing the second data to convert the second data into the first data, and a global buffer transmitting data between the page buffer groups.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Hereinafter, embodiments of the present invention will be described in greater detail with reference to the accompanying drawings. In the following description, only parts necessary for understanding the operation according to the present invention will be described, and descriptions of other parts will be omitted so as not to obscure the gist of the present invention. In addition, we note that the present invention may be embodied in different other forms and should not be construed as being limited only to the embodiments set forth herein. Rather, these embodiments are provided so that this invention will be thorough and complete, and will fully convey the scope of the example embodiments to those skilled in the art.

Throughout the specification, when an element is referred to as being "coupled" to another element, it can be directly connected or coupled to another element or "be indirectly coupled" to another element with one or more intervening elements interposed therebetween. In addition, throughout the specification, when an element is referred to as "including" a component, this indicates that the element may further include another component instead of excluding another component.

Figure 1:
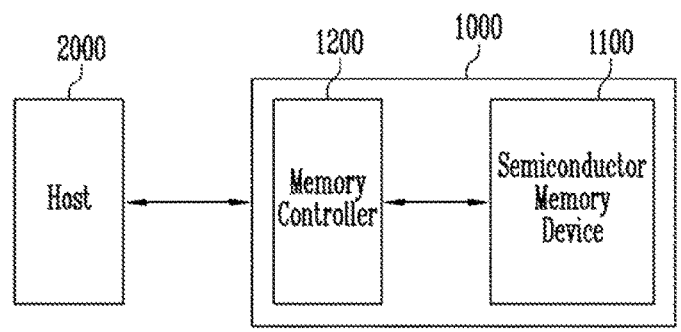
FIG. 1 is a diagram illustrating a memory system according to an embodiment of the present invention.

FIG. 1 is a diagram illustrating a memory system 1000 according to an embodiment of the present invention.

Referring to FIG. 1, the memory system 1000 may include a semiconductor memory device 1100 for storing data, and a memory controller 1200 for controlling the semiconductor memory device 1100 according to control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA), or a serial attached SCSI (SAS). In addition, interface protocols between the host 2000 and the memory system 1000 may not be limited to the above-described examples, and may be one of other interface protocols such as universal serial bus (USB), a multi-media card (MMC), an enhanced small disk interface (ESDI) or integrated drive electronics (IDE).

The memory controller 1200 may control all operations of the memory system 1000 and control data exchange between the host 2000 and the semiconductor memory device 1100. For example, the memory controller 1200 may control the semiconductor memory device 1100 to program or read data according to a request from the host 2000. In addition, the memory controller 1200 may store information of main memory blocks and sub-memory blocks included in the semiconductor memory device 1100, and select the main memory blocks or sub-memory blocks in the semiconductor memory device 1100 to perform a program operation on the selected memory block according to the amount of loaded data for the program operation. According to an embodiment, the semiconductor memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The semiconductor memory device 1100 may perform a program operation, a read operation, or an erase operation under the control of the memory controller 1200. During the program operation, the semiconductor memory device 1100 may randomize data inputted from an external device to generate random data, temporarily store the random data, and program the random data to memory cells. During the read operation, the semiconductor memory device 1100 may perform an error correction operation on data read from the memory cells and de-randomize the error-corrected data into the original data to output the original data.

Figure 2:
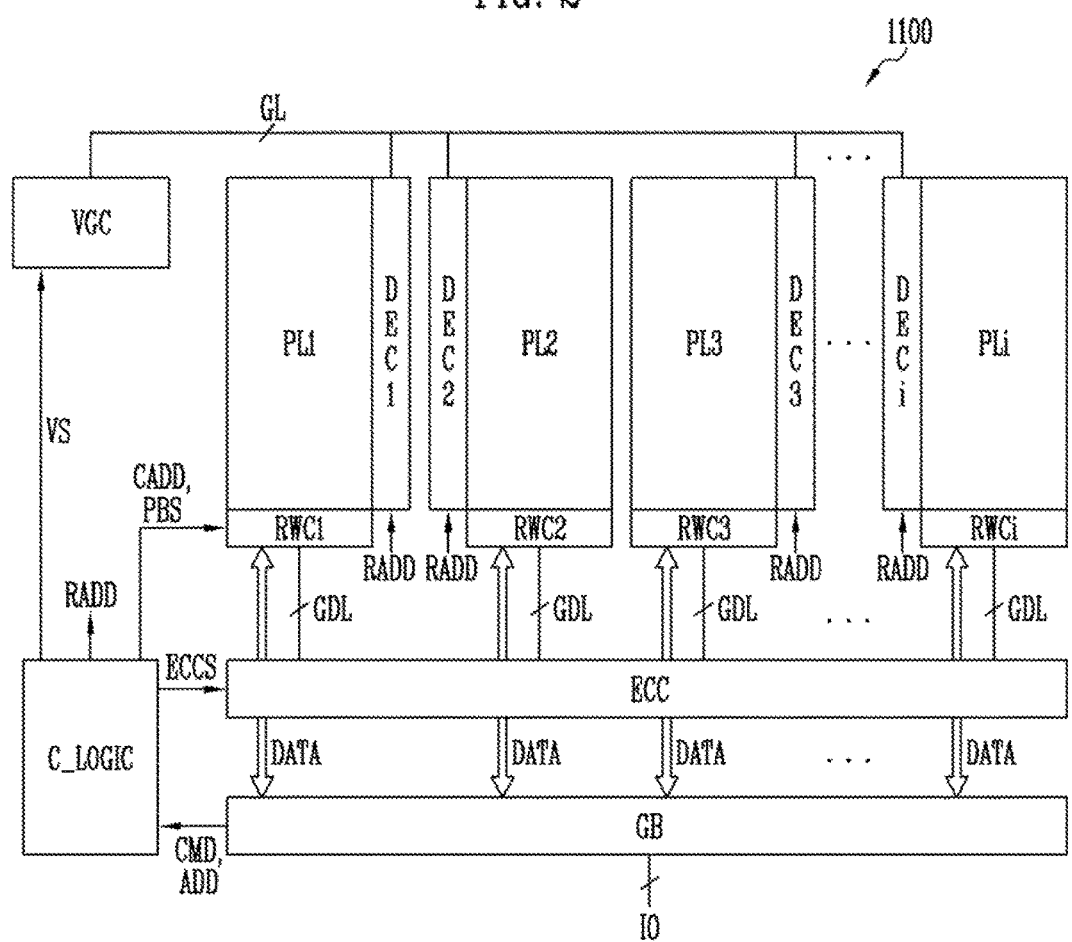
FIG. 2 is a diagram Illustrating a semiconductor memory device according to an embodiment of the present invention.

FIG. 2 is a diagram illustrating a semiconductor memory device according to an embodiment of the present invention.

Referring to FIG. 2, the semiconductor memory device 1100 may include a plurality of planes PL1 to PLi, i being an integer greater than 1, a voltage generation circuit VGC generating voltages at various levels, a plurality of read/write circuits RWC1 to RWCi, a plurality of decoders DEC1 to DECi, an error correction circuit ECC, a global buffer GB and a control logic C_LOGIC.

The voltage generation circuit VGC may generate various voltages required for the program, read, or erase operation in response to a voltage generation signal VS received from the control logic C_LOGIC.

The planes PL1 to PLi may each include a plurality of memory cells for storing data. Each of the planes PL1 to PLi may be paired with a corresponding read/write circuit among the plurality of read/write circuits RWC1 to RWCi and a corresponding decoder among the plurality of decoders DEC1 to DECi, respectively, for performing the program, read or erase operation on selected memory cells. For example, the first read/write circuit RWC1 and the first decoder DEC1 may be coupled to the first plane PL1. A second read/write circuit RWC2 and a second decoder DEC2 may be coupled to a second plane PL2. In the same manner, the ith read/write circuit RWCi and the ith decoder DECi may be coupled to the ith plane PLi.

The read/write circuits RWC1 to RWCi may temporarily store data converted by the error correction operation or a randomization operation during the read operation or the program operation on a selected plane from the planes PL1 to PLi, in response to a column address CADD and page buffer control signals PBS output from the control logic C_LOGIC. The read/write circuits RWC1 to RWCi may temporarily store the data input from the external device, the random data, and parity data input from the error correction circuit ECC.

The decoders DEC1 to DECi may be coupled to the voltage generation circuit VGC via global lines GL and may transmit voltages transmitted through the global lines GL to a selected plane during the program or the read operation on the selected plane, in response to a row address RADD output from the control logic C_LOGIC.

The global buffer GB may transmit a command CMD, an address ADD, and data DATA between the external device and the semiconductor memory device 1100. For example, the global buffer GB may be coupled to the external device via input/output lines IO. The external device may be the memory controller (1200 of FIG. 1). For example, during the program operation, when the command CMD, the address ADD or the data DATA is received through the input/output lines IO, the global buffer GB may transmit the command CMD and the address ADD to the control logic C_LOGIC and transmit the data DATA to a selected read/write circuit, among the read/write circuits RWC1 to RWCi. For example, during the read operation, the global buffer GB may output the data DATA output from the selected read/write circuit to the external device via the input/output lines IO.

The error correction circuit ECC may be coupled to the read/write circuits RWC1 to RWCi via global data Lines GDL. The error correction circuit ECC may perform a randomization operation and a de-randomization operation in addition to the error correction operation in response to error correction signals ECCS received from the control logic C_LOGIC. For example, during the program operation, the error correction circuit ECC may perform the randomization operation using the input data from the external device and transmit the random data generated by performing the randomization operation to the selected read/write circuit. For example, the randomization operation may be performed by calculating the input data and a seed data and generating the random data. The seed data may be stored in a portion of registers included in the error correction circuit ECC or in a separate register provided outside the error correction circuit ECC.

In addition, the error correction circuit ECC may generate parity data for the input data during the program operation. For example, the error correction circuit ECC may divide the input data into a plurality of groups and generate a parity bit for each group. Such parity bits may be referred to as parity data. The parity data may be used to detect and correct errors of the data read during the read operation. For example, the error correction circuit ECC may divide the input data into a plurality of column units and generate a single parity bit for the data included in each column unit. For example, when the data of the selected page corresponds to the first to twentieth columns, respectively, a first parity bit may be generated in the data of the first to fourth columns, a second parity bit may be generated in the data of the fifth to eighth columns, and a fifth parity bit may be generated in the data of the seventeenth to twentieth columns in such a manner. The error correction circuit ECC may transmit the parity data to the read/write circuit when transmitting the random data to the selected read/write circuit. During the read operation, the error correction circuit ECC may receive the parity data together the data read from the selected read/write circuit. For example, the error correction circuit ECC may perform the error correction operation on the read data by using the parity data, de-randomize the error-corrected read data, and transmit the de-randomized data to the selected read/write circuit. For example, during the read operation, the error correction circuit ECC may perform an error checking and correction operation by using a parity bit corresponding to each column unit. For example, the error correction circuit ECC may sequentially receive the read data and the parity data and use the parity bit corresponding to each column unit to perform the error checking and correction operation on the data of the corresponding column unit.

Figure 3:
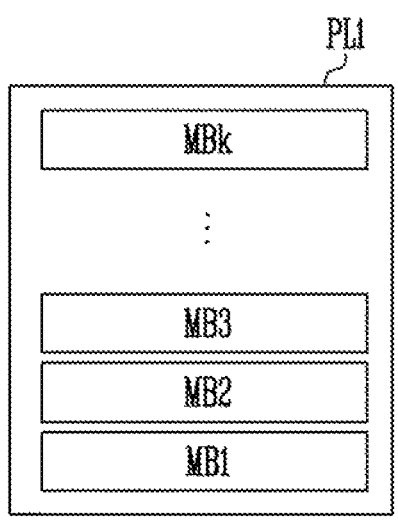
FIG. 3 is a diagram illustrating a first plane of FIG. 2.

FIG. 3 is a diagram illustrating a first plane PL1 of FIG. 2. Since the planes PL1 to PLi are configured to be similar with one another, only the first plane PL1 will be exemplarily described.

Referring to FIG. 3, the first plane PL1 may include a plurality of memory blocks MB1 to MBk, k being an integer greater than 1. The memory blocks MB1 to MBk may be configured to be similar with one another. The program, read, or erase operation may be performed on a selected memory block from the plurality of memory blocks MB1 to MBk.

Figure 4:
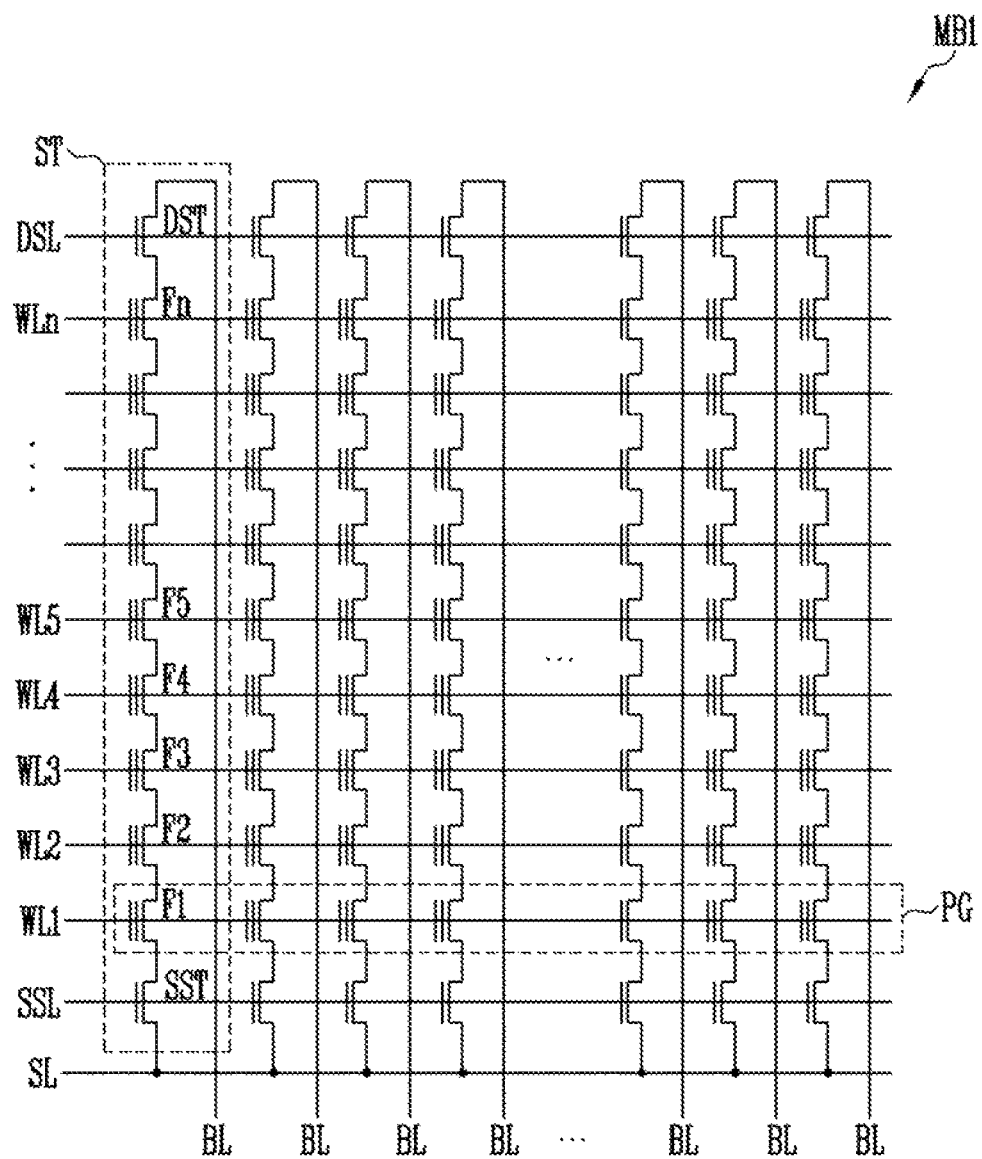
FIG. 4 is a diagram illustrating a first memory block of FIG. 3.

FIG. 4 is a diagram illustrating a first memory block MB1 of FIG. 3. Since the memory blocks MB1 to MBk are configured to be similar with one another, the first memory block MB1 will be exemplarily described.

Referring to FIG. 4, the first memory block MB1 may include a plurality of strings ST, each string being coupled between a corresponding bit line BL among the plurality of it lines BL and a common source line SL shared by the plurality of strings ST. Since the strings ST are configured to be similar with one another, any one of the strings ST will be described as follows.

The string ST may include source select transistors SST, first to nth memory cells F1 to Fn (n is a positive integer) and drain select transistors DST coupled in series in the recited order between the common source line SL and a corresponding bit line BL. FIG. 4 is an exemplary embodiment for understanding the configuration of the first memory block MB1. Thus, the numbers of source and drain select transistors SST and DST and the first to nth memory cells F1 to Fn are not limited to those shown in FIG. 4.

The source select transistor SST may be coupled between the source line SL and a first memory cell F1. The first to nth memory cells F1 to Fn may be coupled in series between the source select transistor SST and the drain select transistor DST. The drain select transistor DST may be coupled between the nth memory cell Fn and the bit line BL. Although not shown in FIG. 4, dummy cells may be further coupled between the source select transistor SST and the drain select transistor DST.

Gates of the source select transistors SST included in different strings ST may be coupled to a source select line SSL, gates of the first to nth memory cells F1 to Fn may be coupled to first to nth word lines WL1 to WLn, respectively, and gates of the drain select transistors DST may be coupled to drain select line DSL.

A group of memory cells coupled to the same word line may be referred to as a page PG. The program and read operations may be performed in a page unit in the selected memory block.

Figure 5:
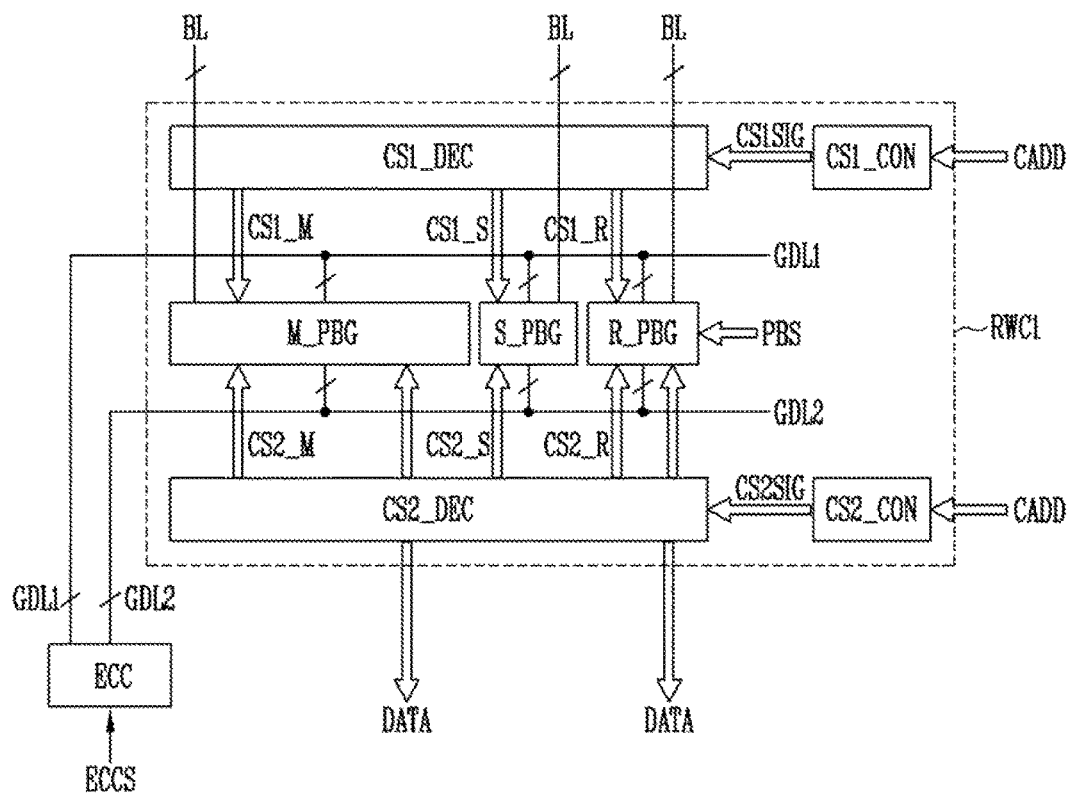
FIG. 5 is a diagram showing a first exemplary embodiment of a read/write circuit of FIG. 2.

FIG. 5 is a diagram showing a first exemplary embodiment of a read/write circuit of FIG. 2, and the first read/write circuit RWC1 will be exemplarily described.

Referring to FIG. 5, the first read/write circuit RWC1 may include page buffer groups M_PBG, S_PBG and R_PBG, a first column selection decoder CS1_DEC, a first column selection controller CS1_CON, a second column selection decoder CS2_DEC, and a second column selection controller CS2_CON.

The page buffer groups M_PBG, S_PBG, and R_PBG may include a main page buffer group M_PBG, a spare page buffer group S_PBG, and a repair page buffer group R_PBG.

The main page buffer group M_PBG may include a plurality of main page buffers coupled to the bit lines BL. The main page buffer group M_PBG may temporarily store the data DATA received from the external device (for example, the memory controller 1200 of FIG. 1) or the random data randomized by the error correction circuit ECC, and perform the program operation or the read operation on the selected page by using the random data. The main page buffer group M_PBG may exchange data with the error correction circuit ECC via a first global data line GDL1 or a second global data line GDL2 In response to first main column selection signals CS1_M or second main column selection signals CS2_M.

The spare page buffer group S_PBG may include a plurality of spare page buffers coupled to the bit lines BL. The spare page buffer group S_PBG may store the parity data. The spare page buffer group S_PBG may exchange the parity data with the error correction circuit ECC through the first global data line GDL1 or the second global data line GDL2 in response to first spare column selection signals CS1_S or second spare column selection signals CS2_S.

The repair page buffer group R_PBG may include a plurality of repair page buffers coupled to the bit lines BL. The repair page buffer group R_PBG may be used to replace a defective column, i.e., a defective bit line among the bit lines BL coupled to the main page buffer group M_PBG. Thus, the repair page buffer group R_PBG may be configured to temporarily store repair data, and perform the program operation or the read operation on the selected page by using the repair data. To this end, the repair page buffer group R_PBG may receive the data DATA input from the external device or output the data read from the memory cells to the external device. The repair page buffer group R_PBG may exchange the repair data with the error correction circuit ECC through the first global data line GDL1 or the second global data line GDL2 in response to first repair column selection signals CS1_R or second repair column selection signals CS2_R.

The page buffer groups M_PBG, S_PBG and R_PBG may operate in response to the page buffer control signals PBS.

The first column selection control circuit CS1_CON may provide the first column selection control signals CS1SIG to the first column selection decoder CS1_DEC in response to the column address CADD.

The first column selection decoder CS1_DEC may output the first main column selection signals CS1_M, the first spare column selection signals CS1_S, or the first repair column selection signal CS1_R in response to the first column selection control signals CS1SIG. The first main column selection signals CS1_M may be applied to the main page buffers included in the main page buffer group M_PBG, respectively, the first spare column selection signals CS1_S may be applied to the spare page buffers included in the spare page buffer group S_PBG, respectively, and the first repair column selection signals CS1_R may be applied to the repair page buffers included in the repair page buffer group R_PBG, respectively. The page buffers included in the main page buffer group M_PBG, the spare page buffer group S_PBG, and the repair page buffer group R_PBG may transmit the data stored therein to the first global data line GDL1 in response to the first main column selection signals CS1_M, the first spare column selection signals CS1_S, and the first repair column selection signals CS1_R.

The second column selection control circuit CS2_CON may provide the second column selection control signals CS2SIG to the second column selection decoder CS1_DEC in response to the column address CADD.

In response to the second column selection control signals CS2SIG, the second column selection decoder CS2_DEC may output the second main column selection signals CS2_M, the second spare column selection signals CS2_S, or the second repair column selection signals CS2_R. The second column selection decoder CS2_DEC may selectively output the second main column select signals CS2_M, the second spare column selection signals CS2_S, and the second repair column selection signals CS2_R in response to the second column selection control signals CS2SIG. The second main column selection signals CS2_M may be applied to the main page buffers included in the main page buffer group M_PBG, respectively, the second spare column selection signals CS2_S may be applied to the spare page buffers included in the spare page buffer group S_PBG, respectively, and the second repair column selection signals CS2_R may be applied to the repair page buffers included in the repair page buffer group R_PBG, respectively. The page buffers included in the main page buffer group M_PBG, the spare page buffer group S_PBG, and the repair page buffer group R_PBG may store the data transmitted from the second global data line GDL2 In response to the second main column selection signals CS2_M, the second spare column selection signals CS2_S, and the second repair column selection signals CS2_R.

The page buffer groups M_PBG, S_PBG and R_PBG will be described in more detail below in reference to FIG. 6.

Figure 6:
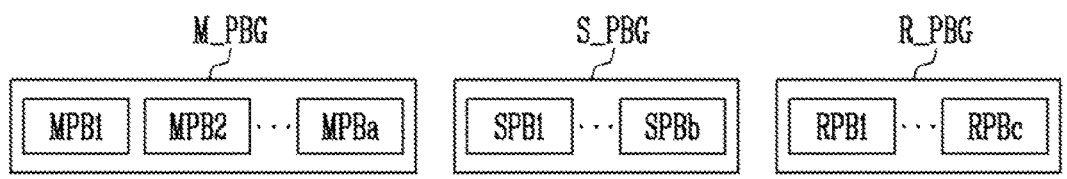
FIG. 6 is a diagram illustrating page buffer groups of FIG. 5.

FIG. 6 is a diagram Illustrating the page buffer groups M_PBG, S_PBG and R_PBG of FIG. 5.

Referring to FIG. 6, each of the main page buffer group M_PBG, the spare page buffer group S_PBG, and the repair page buffer group R_PBG may include a plurality of page buffers. For example, the main page buffer group M_PBG may include first to $a^{th}$ main page buffers MPB1 to MPBa, a being an integer greater than 1, the spare page buffer group S_PBG may include first to $b^{th}$ spare page buffers SPB1 to SPBb, b being an integer greater than 1, and the repair page buffer group R_PBG may include first to $c^{th}$ repair page buffers RPB1 to RPBc, c being an integer greater than 1. The number of page buffers included in the main page buffer group M_PBG, the spare page buffer group S_PBG, and the repair page buffer group R_PBG may vary depending on each semiconductor device.

The page buffers included in the main page buffer group M_PBG, the spare page buffer group S_PBG, and the repair page buffer group R_PBG may be configured to be similar with one another. Therefore, only two of the main page buffers included in the main page buffer group M_PBG is exemplarily described below in reference to FIG. 7.

Figure 7:
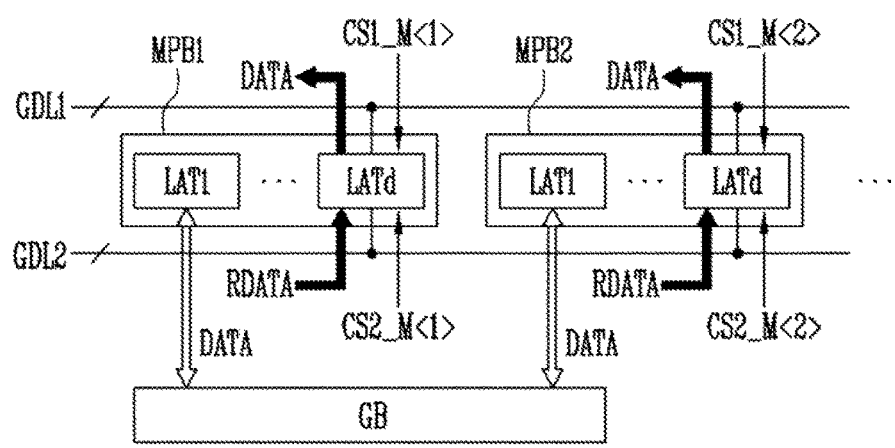
FIG. 7 is a diagram illustrating page buffers of FIG. 6.

More specifically, FIG. 7 is a diagram exemplarily illustrating first and second main page buffers MPB1 and MPB2 included in the main page buffer group M_PBG of FIG. 6.

Referring to FIGS. 5, 6 and 7, the first and second main page buffers MPB1 and MPB2 may be configured to be similar with each other. Each of the first and second main page buffers MPB1 and MPB2 may include a plurality of latches. For example, first to $d^{th}$ latches LAT1 to LATd, d being an integer greater than 1, may be included in each of the first and second main page buffers MPB1 and MPB2, respectively. The number of first to dth latches LAT1 to LATd may vary depending on each semiconductor memory device.

The first to dth latches LAT1 to LATd may exchange data with each other. The first to dth latches LAT1 to LATd may be classified into a first portion coupled to the global buffer GB to exchange the data DATA with the external device through the global buffer GB, a second portion coupled to first and second global data lines GDL1 and GDL2 to exchange the data DATA with the error correction circuit ECC through the first and second global data lines GDL1 and GDL2, and a third portion coupled to the bit lines BL to exchange the data with the selected memory cells during the program operation or the read operation. For example, the first latches LAT1 may be coupled to the global buffer GB and the dth latches LATd may be coupled to the first and second global data lines GDL1 and GDL2 as Illustrated in FIG. 7.

The dth latches LATd may exchange the data with the first and second global data lines GDL1 and GDL2 in response to first main column selection signals CS1_M<1> and CS1_M<2>, and second main column selection signals CS2_M<1> and CS2_M<2>. The dth latch LATd included in the first main page buffer MPB1 may operate in response to the first main column selection signal CS1_M<1> or the second main column selection signal CS2_M<i>, the dth latch LATd included in the second main page buffer MPB2 may operate in response to the first main column selection signal CS1_M<2> or the second main column selection signal CS2_M<2>. The first main column selection signals CS1_M may be sequentially applied to the first to a$^{th}$ main page buffers MPB1 to MPBa. For example, when the first main column selection signal CS1_M<1> is applied to the dth latch LATd of the first main page buffer MPB1, the data DATA stored therein may be transmitted to the first global data line GDL1. Subsequently, when the first main column selection signal CS1_M<2> is applied to the dth latch LATd of the second main page buffer MPB2, the data DATA stored therein may be transmitted to the first global data line GDL1. That is, the first column selection decoder CS1_DEC may sequentially transmitted the same number of first main column selection signals CS1_M as the number of the main page buffers included in the main page buffer group (M_PBG In FIG. 5).

Therefore, in response to the first main column selection signal CS1_M<1>, the data stored in the dth latch LATd of the first main page buffer MPB1 may be applied to the first global data line GDL1, and the data applied to the first global data line GDL1 may be transmitted to the error correction circuit ECC. The data stored in the dth latch LATd of the second main page buffer MPB2 may be applied to the first global data line GDL1 in response to the first main column selection signal CS1_M<2> and the data applied to the global data line GDL1 may be transmitted to the error correction circuit ECC. In such a manner, the first column selection decoder CS1_DEC may sequentially transmitted the first main column selection signals CS1_M<1> to CS1_M<a>. The first to a$^{th}$ page buffers MPB1 to MPBa included in the main page buffer group M_PBG may sequentially transmit the data DATA stored in each of the dth latches LATd to the first global data line GDL1 in response to the sequentially transmitted first main column selection signals CS1_M<1> to CS1_M<a>. The data DATA transmitted to the first global data line GDL1 may be sequentially applied to the error correction circuit ECC. The data of the second main page buffer MPB2 may be transmitted to the first global data line GDL1 after the data of the first main page buffer MPB1 transmitted to the first global data line GDL1 is transmitted to the error correction circuit ECC.

The data stored in the spare and repair page buffer groups S_PBG and R_PBG may be transmitted to the error correction circuit ECC via the first global data line GDL1 in the manner described above.

Meanwhile, the second column selection decoder CS2_DEC may sequentially transmitted the second main column selection signals CS2_M<1> to CS2_M<a>. When the data randomized in the error correction circuit ECC is referred to as random data RDATA, the random data RDATA may be sequentially transmitted to the first to a$^{m}$ main page buffers MPB1 to MPBa through the second global data line GDL2 in response to the second main column selection signals CS2_M<1> to CS2_M<a> in the same manner described above. The error correction circuit ECC may sequentially transmit the random data RDATA to the second global data line GDL2 In response to the error correction signals ECCS. In addition, when the error correction circuit ECC performs a de-randomization operation to restore the random data RDATA to the original data, the restored data DATA may be transmitted to the first to a$^{th}$ main page buffers MPB1 to MPBa via the second global data line GDL2.

Subsequently, a connection between the first and second global data lines GDL1 and GDL2 and the dth latches LATd will be described below.

Figure 8:
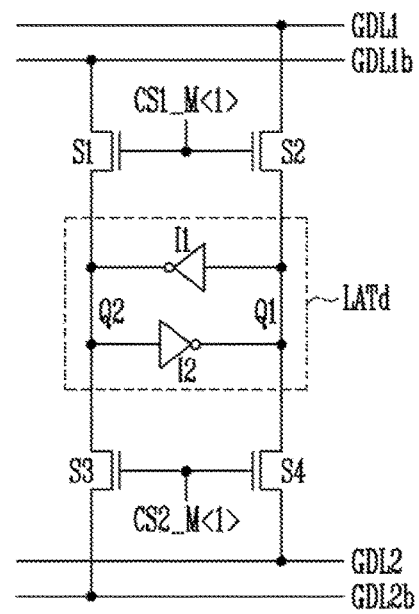
FIG. 8 is a diagram illustrating a latch of FIG. 7.

FIG. 8 is a diagram illustrating a latch of FIG. 7.

Referring to FIG. 8, the first global data line GDL1 may be paired with a first global inverted data line GDL1b, and the second global data line GDL2 may be paired with a second global inverted data line GDL2b. Differential data may be simultaneously applied to the first global data line GDL1 and the first global inverted data line GDL1b, and differential data may be simultaneously applied to the second global data line GDL2 and the second global inverted data line GDL2b. For example, when a high level data '1' is applied to the first global data line GDL1, a low level data '0' may be applied to the first global inverted data line GDL1b, and when the low level data '0' is applied to the first global data line GDL1, the high level data '1' may be applied to the first global inverted data line GDL1b.

The page buffer may include first to fourth switches S1 to S4 for electrically connecting or disconnecting the first and second global data lines GDL1 and GDL2 and the first and second global inverted data lines GDL1b and GDL2b to or from the dth latch LATd. The first to fourth switches S1 to S4 may be embodied as NMOS transistors.

The first and second switches S1 and S2 may electrically connect or disconnect the first global data line GDL1 and the first global inverted data line GDL1b to or from the dth latch LATd in response to the first main column selection signal CS1_M<1>. The third and fourth switches S3 and S4 may electrically connect or disconnect the second global data line GDL2 and the second global inverted data line GDL2b to or from the latch LATd in response to the second main column selection signal CS2_M<1>. The first switch S1 may be coupled between the first global inverted data line GDL1b and a second input node Q2, and the second switch S2 may be coupled between the first global data line GDL1 and a first input node Q1. The third switch S3 may be coupled between the second global inverted data line GDL2b and the second input node Q2, and the fourth switch S4 may be coupled between the second global data line GDL2 and the first input node Q.

The dth latch LATd may include first and second inverters I1 and I2 coupled in parallel between the first and second input nodes Q1 and Q2. Accordingly, the data of the first input node Q1 may have a level opposite to the data of the second input node Q2. The first input node Q1 may be coupled to the first global data line GDL1 through the second switch S2 or to the second global data line GDL2 through the fourth switch S4. The second input node Q2 may be coupled to the first global inverted data line GDL1b via the first switch S1 or to the second global inverted data line GDL2b via the third switch S3. Therefore, when the first main column selection signal CS1_M<1> at a high level is applied to the first and second switches S1 and S2, the data of the first input node Q1 and the data of the second input node Q2 may be simultaneously transmitted to the first global data Line GDL1 the first global inverted data line GDL1b, respectively. When the second main column selection signal CS2_M<1> at the high level is applied to the third and fourth switches S3 and S4, the data of the second global data line GDL2 and the data of the second global inverted data line GDL2b may be simultaneously transmitted to the first input node Q1 and the second input node Q2, respectively.

Figure 9:
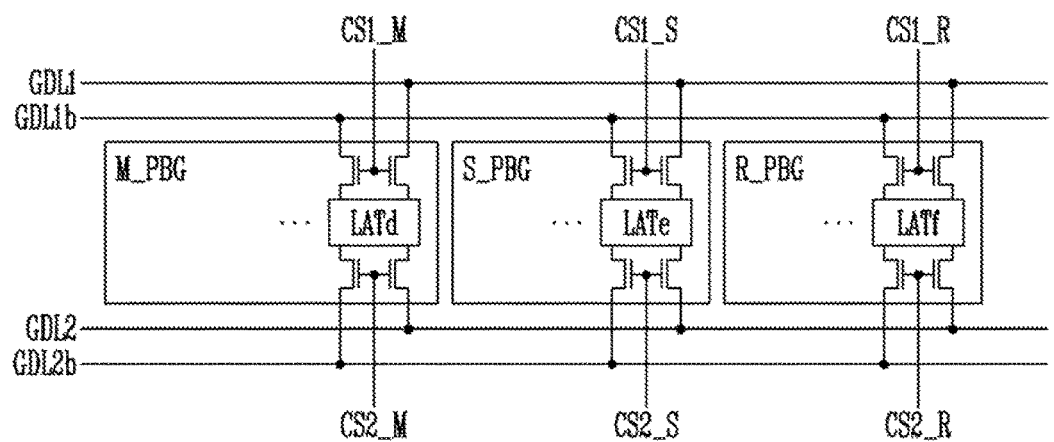
FIG. 9 is a diagram showing a connection between a global data line and a latch according to the first exemplary embodiment of the present invention.

FIG. 9 is a diagram showing a connection between a global data line and a latch according to a first exemplary embodiment of the present invention described with reference to FIGS. 5 to 8.

Referring to FIG. 9, the first global data line GDL1 and the first global inverted data line GDL1b may form a pair and may be commonly coupled to latches LATd, LATe, and LATf (d, e, and f are positive integers) of the page buffers included in the main page buffer group M_PBG, the spare page buffer group S_PB, and the repair page buffer group R_PBG.

The data stored in the main page buffer group M_PBG, the spare page buffer group S_PBG and the repair page buffer group R_PBG may be selectively transmitted to the first global data line GDL1 and the first global inverted data line GDL1b in response to the first main column selection signals CS1_M, the first spare column selection signals CS1_S, and the first repair column selection signals CS1_R, respectively.

The second global data line GDL2 and the second global inverted data line GDL2b may form a pair and may be commonly coupled to the latches LATd, LATe and LATf of the page buffers included in the main page buffer group M_PBG, the spare page buffer group S_PBG, and the repair page buffer group R_PBG through the switches which were described in detail with reference to FIG. 8 above.

The data stored in the main page buffer group M_PBG, the spare page buffer group S_PBG, and the repair page buffer group R_PBG may be selectively transmitted to the second global data line GDL2 and the second global inverted data line GDL2b in response to the second main column selection signals CS2_M, the second spare column selection signals CS2_S, and the second repair column selection signals CS2_R.

Figure 10:
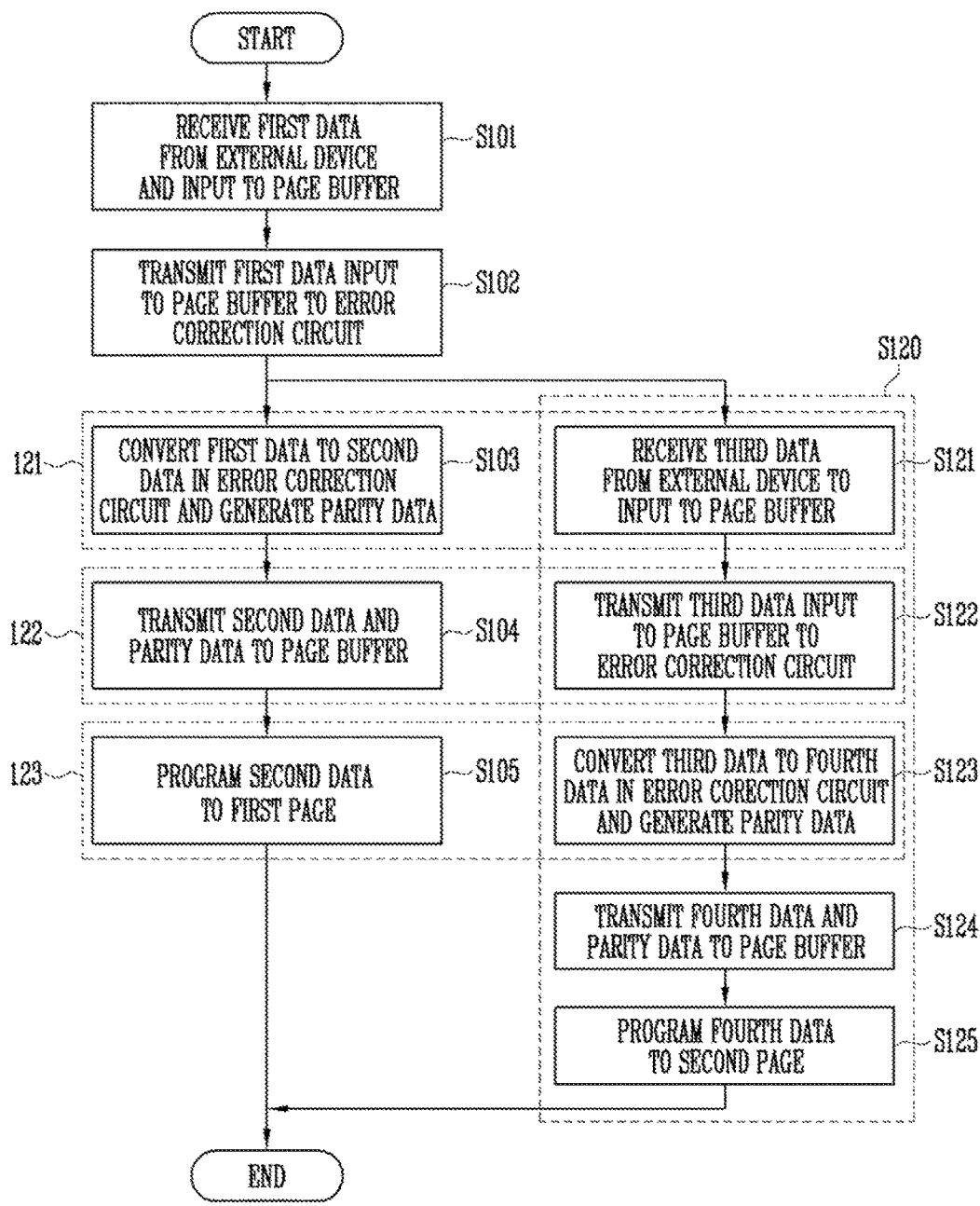
FIG. 10 is a flow chart showing a program operation according to an embodiment of the present invention.

FIG. 10 is a flow chart showing a program operation of a semiconductor memory device, according to an embodiment of the present invention. The semiconductor memory device may be the semiconductor memory device described above with reference to FIGS. 1 to 9.

Referring to FIG. 10, the semiconductor memory device may receive first data from the external device and input the first data to at least one page buffer (S101). For example, the external device may be the memory controller 1200 of FIG. 1. The at least one page buffer may be one of the page buffers of the semiconductor memory device 1100 of FIG. 2. More specifically, the first data may be inputted to the main page buffers included in the main page buffer group M_PBG of FIG. 5. When there is a defective column, among the columns corresponding to the main page buffers, data to be stored in the defective column among the first data may be inputted to the repair page buffers included in the repair page buffer group R_PBG of FIG. 5. The first data received from the external device may be inputted to first latches of the page buffers, respectively. For example, the first data may be inputted to the first latches of the main page buffers included in the main page buffer group M_PBG of FIG. 5.

The first data inputted to the page buffers may be transmitted to the error correction circuit ECC of FIG. 5 (S102). For example, when the first and second global data lines GDL1 and GDL2 of FIG. 9 and the first and second global inverted data lines GDL1b and GDL2b of FIG. 9 are coupled to second latches, the first data input to the first latches of the page buffers may be transmitted to the second latches included in the same page buffers. The first data transmitted to the second latches may be sequentially transmitted to the error correction circuit ECC through the first global data line GDL1 and the first global inverted data line GDL1b.

The error correction circuit ECC may convert the first data into second data and generate parity data for the second data (S103). More specifically, the error correction circuit ECC may perform a randomization operation using seed data to convert the first data into second data and generate the parity data for the second data.

Subsequently, the error correction circuit ECC may transmit the second data and the parity data to the page buffers (S104). For example, the second data may be transmitted to the main page buffer group M_PBG and the parity data may be transmitted to the spare page buffer group S_PBG, via the second global data line GDL2 and the second global inverted data line GDL2b. When a repair operation is performed due to defects in a portion of the bit lines and, the second data may be distributed and transmitted to the main page buffer group M_PBG and the repair page buffer group R_PBG. For example, data corresponding to a normal column address of the second data may be transmitted to the main page buffer group M_PBG, and data corresponding to a defective column address may be transmitted to the repair page buffer group R_PBG in replacement of the main page buffer group M_PBG. At S104, the second data may be transmitted to the second latches of the page buffers and transmitted to third latches for performing the program operation.

The control logic (C_LOGIC of FIG. 2) may control the voltage generation circuit (VGC of FIG. 2) and the read/write circuits (RWC1 to RWCi of FIG. 2) so that the second data input to the main page buffer group M_PBG or to the main page buffer group M_PBG and the repair page buffer group R_PBG may be programmed to the selected page of the selected memory block (S105). For example, the program operation on the selected page may be performed by using the second data transmitted to the third latches of the page buffers. For example, when a program target page is a first page, the program operation may be repeatedly performed until all the programs of the selected memory cells included in the first page are completed.

A data transmission operation for the program operation on the first page (S103 to S105) may overlap with a portion of a data transmission operation for the program operation on a second page (S120). The program operation will be described in more detail as below.

When the first data is converted into the second data and the parity data is generated for the program operation on the first page (S103), third data for the program operation on the second page may be transmitted from the external device to the page buffers (S121). For example, when the first data is converted into the second data in the error correction circuit ECC (S103), since the first latches of the page buffers are not used, the third data for the second page may be inputted to the first latches. To this end, an initialization operation of the first latches may be further performed before the third data may be inputted to the first latches.

When the second data and the parity data for the first page are transmitted to the page buffers (S104), the third data for the program operation on the second page may be transmitted to the error correction circuit ECC (S122). For example, after the second data for the first page is transmitted from the second latches to the third latches of the page buffers, the third data for the second page may be transmitted from the first latches to the second latches of the page buffers. The third data transmitted to the second latches may be transmitted to the error correction circuit ECC via the first global data line GDL1 and the first global inverted data line GDL1b. To this end, after the second data is transmitted from the second latches to the third latches, an initialization operation of the second latches may be further performed. When the second latches are initialized, the third data may be transmitted to the second latches from the first latches, and the third data transmitted to the second latches may be transmitted to the error correction circuit ECC.

When the second data is programmed to the first page (S105), the error correction circuit ECC may convert the third data into fourth data (S123). For example, the error correction circuit ECC may perform the randomization operation using the seed data to convert the third data into the fourth data and generate the parity data for the fourth data (S123).

Since the program operation on the first page overlaps with a portion of the program operation on the second page (S121, S122 and S123) as described above, the program operation time may be reduced.

Subsequently, the error correction circuit ECC may transmit the fourth data and the parity data to the page buffers (S124). For example, the fourth data may be transmitted to the main page buffer group M_PBG and the parity data may be transmitted to the spare page buffer group S_PBG, via the second global data line GDL2 and the second global inverted data line GDL2b. When the repair operation is performed due to the defects in the portion of the bit lines, the fourth data may be distributed and transmitted to the main page buffer group M_PBG and the repair page buffer group R_PBG. For example, the data corresponding to the normal column address of the fourth data may be transmitted to the main page buffer group M_PBG, and the data corresponding to the defective column address may be transmitted to the repair page buffer group R_PBG in replacement of the main page buffer group M_PBG. At S124, the fourth data stored in the error correction circuit ECC may be transmitted to the second latches of the page buffers and retransmitted to the third latches of the page buffers for performing the program operation. To this end, the third latches may be initialized before the fourth data is retransmitted to the third latches.

The control logic C_LOGIC may control the voltage generation circuit VGC and the read/write circuits RWC1 to RWCi so that the fourth data input to the main page buffer group M_PBG or to the main page buffer group M_PBG and the repair page buffer group R_PBG may be programmed to the selected page of the selected memory block (S125). For example, the program operation on the selected page may be performed by using the fourth data retransmitted to the third latches of the page buffers.

The program operation on a plurality of pages included in the selected memory block may be performed in the above-described manner. After the program operation is completed, the read operation on the selected memory block may be performed in reverse order to the program operation. The read operation will be described in more detail as below.

Figure 11:
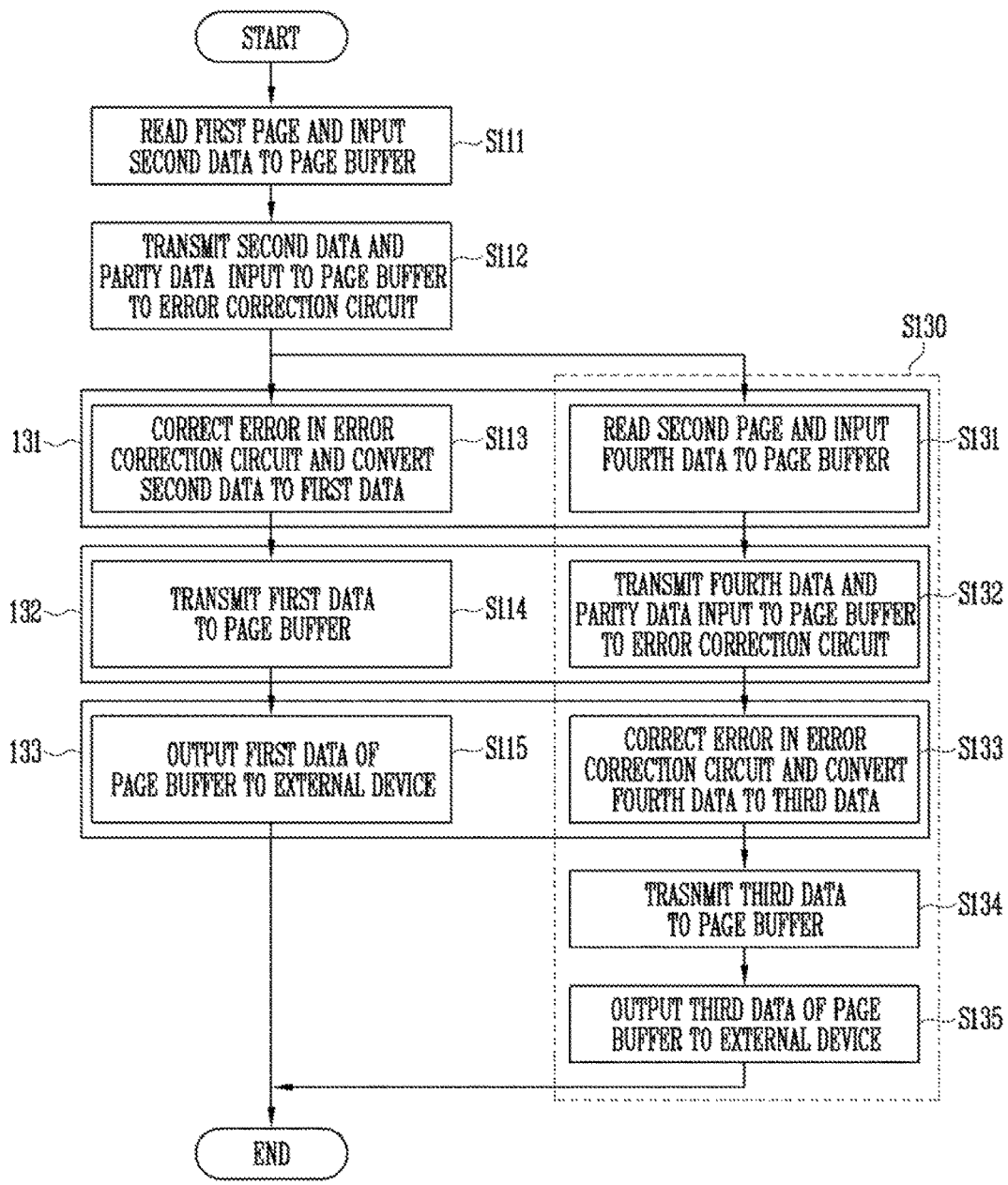
FIG. 11 is a flow chart showing a read operation according to an embodiment of the present invention.

FIG. 11 is a flow chart showing a read operation, of a semiconductor memory device, according to an embodiment of the present invention. The semiconductor memory device may be the semiconductor memory device described above with reference to FIGS. 1 to 9. In addition, FIG. 11 exemplifies the read operations of the first page storing the second data and the second page storing the fourth data of FIG. 10.

Referring to FIG. 11, the memory cells included in the first page may be read to output the second data to at least one of the page buffers (S111). For example, the second data may be inputted the third latches of the page buffers.

The second data inputted to the page buffers may be transmitted to the error correction circuit ECC (S112). The parity data stored in the spare page buffer group S_PBG may be transmitted to the error correction circuit ECC together with the second data. For example, the second data inputted to the third latches of the page buffers may be transmitted to the second latches, and the second data transmitted to the second latches and the parity data stored in the spare page buffer group S_PBG may be transmitted to the error correction circuit ECC through the global data line GDL1 and the first global inverted data line GDL1b.

The error correction circuit ECC may use the parity data received together with the second data to determine whether there is an error in the second data. When there is an error, after correcting the error, the error correction circuit ECC may convert the second data into the first data, which is the original data, using the seed data (S113).

Subsequently, the error correction circuit ECC may transmit the first data to the page buffers (S114). For example, the error correction circuit ECC may transmit the first data to the second latches of the page buffers via the second global data line GDL2 and the second global inverted data line GDL2b. The parity data may not be transmitted to the spare page buffer group S_PBG. The first data transmitted to the second latches of the page buffers may be retransmitted to the first latches of the page buffers to be output.

The first data transmitted to the first latches of the page buffers may be transmitted to the external device (S115). For example, the first data transmitted to the first latches may be transmitted to the memory controller 1200 via the global buffer (GB of FIG. 2).

A data transmission operation for the read operation on the first page (S113 to S115) may overlap with a portion of a data transmission operation for the read operation on the second page (S130). The read operation will be described in more detail as below.

When the second data is converted into the first data for the read operation on the first page (S113), the fourth data read from the memory cells of the second page may be inputted to the third latches of the page buffers (S131). To this end, an initialization operation of the third latches may be further performed before the fourth data is input to the third latches.

Since the first data for the first page is transmitted to the second latches of the page buffers and the first data is retransmitted to the first latches (S114), the second latches of the page buffers may not be used. The fourth data input to the third latches may be transmitted to the second latches, and the fourth data input to the second latches may be transmitted to the error correction circuit ECC (S132). For example, the fourth data may be transmitted to the error correction circuit ECC through the first global data line GDL1 and the first global inverted data line GDL1b. The parity data stored in the spare page buffer group S_PBG may be transmitted to the error correction circuit ECC through the first global data line GDL1 and the first global inverted data line GDL1b.

When the first data input to the first latches of the page buffers is output to the external device (S115), the error correction circuit ECC may use the parity data received together with the fourth data to determine whether there is an error. When there is an error, after correcting the error, the error correction circuit ECC may convert the fourth data into the third data, which is the original data, using the seed data (S133).

Since the read operations of the first page and the second page may be simultaneously performed (S131, S132, and S133) as described above, the read operation time may be reduced.

The error correction circuit ECC may transmit the third data to the page buffers (S134). For example, the error correction circuit ECC may transmit the third data to the second latches of the page buffers via the second global data line GDL2 and the second global inverted data line GDL2b. The parity data may not be transmitted to the spare page buffer group S_PBG. The third data transmitted to the second latches of the page buffers may be retransmitted to the first latches of the page buffers to be output. When the repair operation is performed, data corresponding to the defective column address of the main page buffer group M_PBG of the third data may be transmitted to the page buffers of the repair page buffer group R_PBG.

The third data transmitted to the first latches of the page buffers may be transmitted to the external device (S135). For example, the third data transmitted to the first latches may be transmitted to the memory controller 1200 via the global buffer GB.

As described above, since the page buffers are used to store the parity data generated for the error correction operation in replacement of a separate register, an additional device for temporarily storing the parity data may not be required. Accordingly, sizes of the semiconductor memory device and the memory system including the same may be reduced.

In FIGS. 5 to 11 described above, the first exemplary embodiment including two column selection decoders in one plane has been described, but a semiconductor memory device may be configured so that only one column selection decoder is included in one plane. An embodiment of the feature will be described as a second embodiment as follows.

Figure 12:
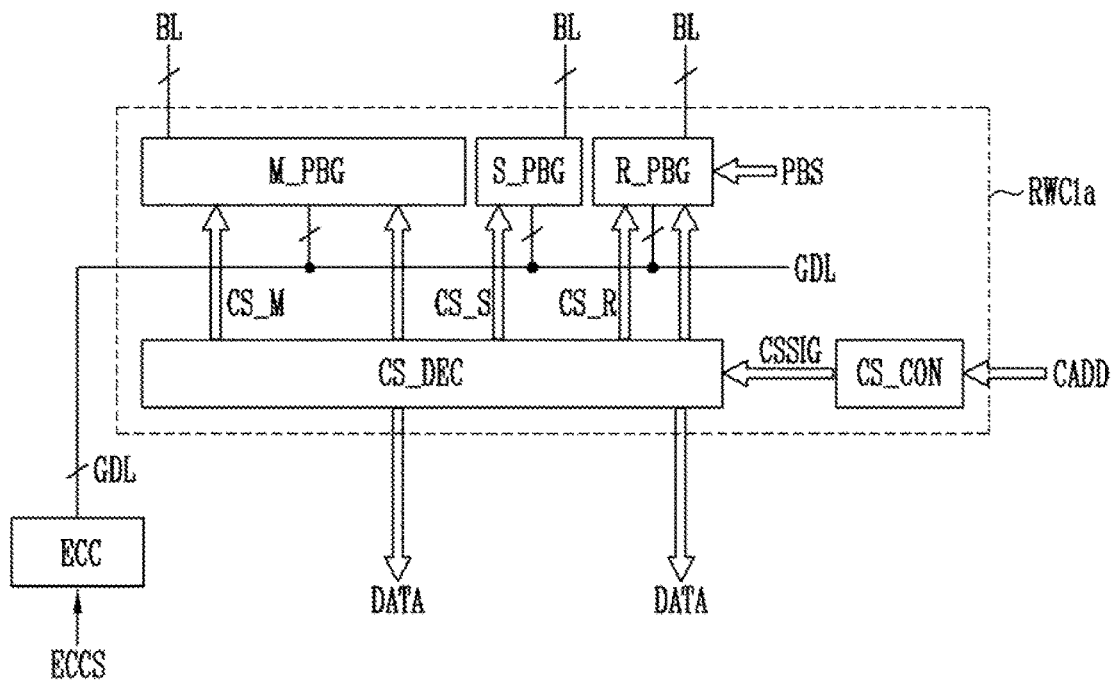
FIG. 12 is a diagram showing a second exemplary embodiment of a read/write circuit of FIG. 2.

FIG. 12 is a diagram showing a second exemplary embodiment of a read/write circuit of FIG. 2, and the first read/write circuit RWC1 will be exemplarily described. In FIG. 12, a first read/write circuit is denoted as 'RWC1a' to be distinguished from the first read/write circuit RWC1 illustrated as the first exemplary embodiment of FIG. 5.

Referring to FIG. 12, the first read/write circuit RWC1a may include page buffer groups M_PBG, S_PBG and R_PBG, a column selection decoder CS_DEC, and a column selection control circuit CS_CON.

The page buffer groups M_PBG, S_PBG and R_PBG may include a main page buffer group M_PBG, a spare page buffer group S_PBG and a repair page buffer group R_PBG.

The main page buffer group M_PBG may include a plurality of main page buffers coupled to the bit lines BL. The main page buffer group M_PBG may temporarily store the data DATA inputted from the external device or the random data randomized by the error correction circuit ECC, and perform the program operation or the read operation on the selected page by using the random data. The main page buffer group M_PBG may exchange the data with the error correction circuit ECC via the global data line GDL in response to main column selection signals CS_M. The external device may be a memory controller, and the page buffer groups M_PBG, S_PBG, and R_PBG may exchange the data with the external device through the global buffer (GB of FIG. 2).

The spare page buffer group S_PBG may include a plurality of spare page buffers coupled to the bit lines BL. The spare page buffer group S_PBG may exchange the parity data with the error correction circuit ECC through the global data line GDL in response to spare column selection signals CS_S.

The repair page buffer group R_PBG may include a plurality of repair page buffers coupled to the bit lines BL. The repair page buffer group R_PBG may be used to replace a defective column, i.e., a defective bit line among the bit lines BL coupled to the main page buffer group M_PBG. The repair page buffer group R_PBG may temporarily store repair data, and perform the program operation or the read operation on the selected page by using the repair data. To this end, the repair page buffer group R_PBG may receive the data DATA from the external device (for example, a memory controller) or transmit the data read from the memory cells to the external device. The repair page buffer group R_PBG may exchange the repair data with the error correction circuit ECC via the global data line GDL in response to repair column selection signals CS_R.

The page buffer groups M_PBG, S_PBG, and R_PBG may operate in response to page buffer control signals PBS.

The column selection decoder CS_DEC may output the main column selection signals CS_M, the spare column selection signals CS_S or the repair column selection signals CS_R in response to column selection control signals CSSIG. For example, the column selection decoder CS_DEC may selectively output the main column selection signals CS_M, the spare column selection signals CS_S and the repair column selection signals CS_R In response to the column selection control signals CSSIG. The main column selection signals CS_M may be applied to the main page buffers included in the main page buffer group M_PBG, respectively, the spare column selection signals CS_S may be applied to the spare page buffers included in the spare page buffer group S_PBG, respectively, and the repair column selection signals CS_R may be applied to the repair page buffers included in the repair page buffer group R_PBG, respectively. The page buffers included in the main page buffer group M_PBG, the spare page buffer group S_PBG, and the repair page buffer group R_PBG may transmit the data stored therein to the global data line GDL in response to the main column selection signals CS_M, the spare column selection signals CS_S, and the repair column selection signals CS_R, respectively.

The column selection control circuit CS_CON may output the column selection control signals CSSIG in response to the column address CADD.

The main page buffers, the spare page buffers, and the repair page buffers may include a plurality of latches, respectively, as described above with reference to FIG. 7. The latches included in the page buffers may be classified into a first portion coupled to the global buffer GB to exchange the data DATA with the external device through the global buffer GB, a second portion coupled to the global data line GDL to exchange the data DATA with the error correction circuit ECC through the global data line GDL, and a third portion coupled to the bit lines BL to exchange the data with the selected memory cells during the program operation or the read operation. Latches included in the same page buffer may exchange data with one another. A latch coupled to the global data line GDL, among the latches described above, will be described in more detail as follows.

Figure 13:
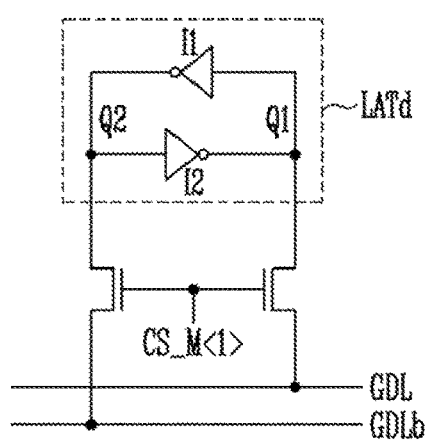
FIG. 13 is a diagram showing a connection between a global data line and a latch according to the second exemplary embodiment of the present invention.

FIG. 13 is a diagram showing a connection between a global data line and a latch according to the second exemplary embodiment of the present invention. As an example, the described latch is one included in the main page buffer.

Referring to FIG. 13, the global data line GDL may be paired with a global inverted data line GDLb. Differential data may be simultaneously applied to the global data line GDL and the global inverted data line GDLb. For example, when a high level data '1' is applied to the global data line GDL, a low level data '0' may be applied to the global inverted data line GDLb and when the low level data '0' is applied to the global data line GDL, the high level data '1' may be applied to the global inverted data line GDLb.

Except for the numbers of global data lines GDL and global inverted data lines GDLb and the number of switches for electrically connecting or disconnecting the global inverted data line GDLb to or from the latch LATd is similar with those in FIG. 8. Thus, a redundant description will be omitted.

However, since the latch LATd shown in FIG. 13 is coupled to the global data line GDL and the global inverted data line GDLb, when the main column selection signal CS_M<1> is activated to a high level, the data stored in the latch LATd may be transmitted to the global data line GDL and the global inverted data line GDLb or the data loaded onto the global data line GDL and the global inverted data line GDLb may be transmitted to the latch LATd.

Data stored in page buffers included in different planes may be transmitted through the global data line GDL and the global inverted data line GDLb. For example, the data stored in the page buffer of the first plane PL1 may be transmitted to the global buffer GB via the global data line GDL and the global inverted data line GDLb, and the data transmitted to the global buffer GB may be transmitted to the page buffer of the second plane PL2 via the global data line GDL and the global inverted data line GDLb.

Figure 14:
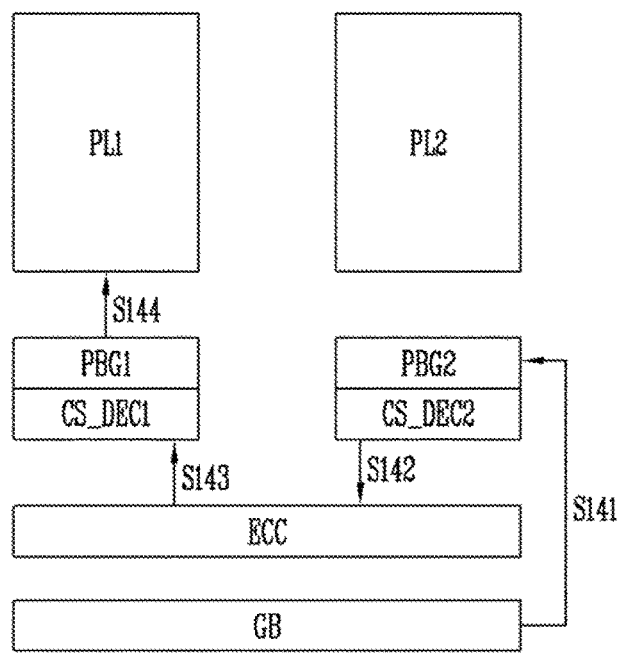
FIG. 14 is a diagram Illustrating a program operation according to an embodiment of the present invention.

FIG. 14 is a diagram illustrating a program operation according to an embodiment of the present invention, and an exemplary embodiment of the program operation of the semiconductor memory device described in FIGS. 12 and 13.

Referring to FIG. 14, the program operation will be described exemplifying the case where the selected plane is the first plane PL1. When the program operation starts to be performed, first data may be transferred from the external device to the global buffer GB and the first data transmitted to the global buffer GB may be temporarily stored in a page buffer group PBG2 included in the second plane PL2 (S141).

Subsequently, the first data inputted to the page buffer group PBG2 may be transmitted to the error correction circuit ECC by a column selection decoder CS_DEC2 (S142). For example, the first data may be transmitted to the error correction circuit ECC through the global data line GDL and the global inverted data line GDLb by the column selection decoder CS_DEC2 included in the second plane PL2. The data transmission method using the column select decoder CS_DEC2 has been described with reference to FIGS. 12 and 13. Thus, a detailed description thereof will be omitted.

The error correction circuit ECC may perform the randomization operation using the seed data to convert the first data into second data and generate the parity data for the second data. The error correction circuit ECC may transmit the second data and the parity data to a page buffer group PBG1 of the first plane PL1 (S143). For example, when the error correction circuit ECC sequentially loads the parity data and the second data to be used for the error correction operation to the global data line GDL and the global inverted data line GDLb, the second data and the parity data loaded on the global data line GDL and the global inverted data line GDLb may be inputted the page buffer group PBG1 by a column selection decoder CS_DEC1 of the first plane PL1. For example, the second data may be inputted to the main page buffer group (M_PBG of FIG. 12) or to the main page buffer group M_PBG and the repair page buffer group (R_PBG of FIG. 12) included in the page buffer group PBG1, and the parity data may be inputted the spare page buffer group (S_PBG of FIG. 12) included in the page buffer group PBG1.

Then, the program operation on the first plane PL1 using the second data may be performed (S144).

Figure 15:
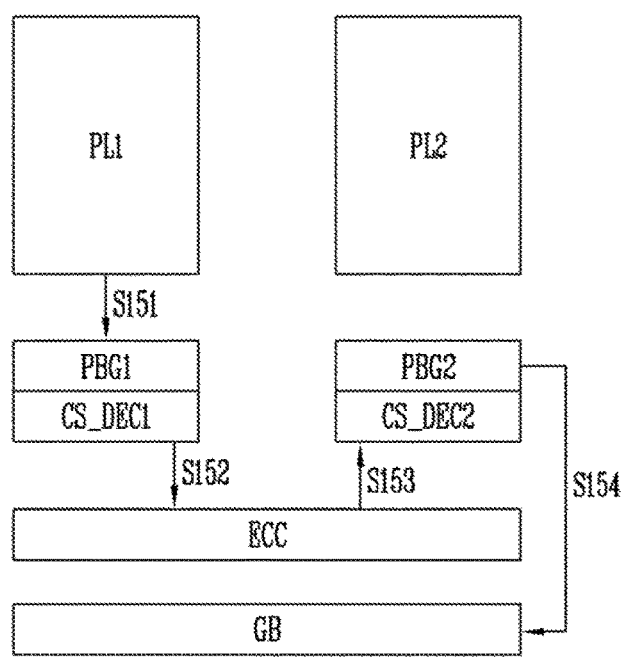
FIG. 15 is a diagram Illustrating a read operation according to an embodiment of the present invention.

FIG. 15 is a diagram illustrating a read operation according to an embodiment of the present invention, for example, the read operation on the first plane PL1 programmed as described in FIG. 14.

When the read operation starts to be performed, the first plane PL1 may be read and the second data may be inputted the page buffer group PBG1 (S151). For example, the selected page of the selected memory block of the first plane PL1 may be read and the second data may be inputted the page buffer group PBG1.

The second data inputted to the page buffer group PBG1 and the parity data stored in the spare page buffer group S_PBG may be transmitted to the error correction circuit ECC by the column selection decoder CS_DEC1 (S152). For example, the second data inputted to the main page buffer group M_PBG or to the main page buffer group M_PBG and the repair page buffer group R_PBG and the parity data stored in the spare page buffer group S_PBG may be supplied to the error correction circuit ECC via the global data line GDL and the global inverted data line GDLb by the column selection decoder CS_DEC1.

The error correction circuit ECC may check an error of the second data by using the parity data and correct the error. The error correction circuit ECC may perform the de-randomization operation using the seed data to restore the second data to the first data, which is the original data.

When the first data is completely restored, the error correction circuit ECC may transmit the first data to the page buffer group PBG2 coupled to the second plane PL2 (S153). For example, the first data may be loaded onto the global data line GDL and the global inverted data line GDLb and transmitted to the page buffer group PBG2 by the column selection decoder CS_DEC2 coupled to the second plane PL2.

The page buffer group PBG2 coupled to the second plane PL2 may transmit the first data to the global buffer GB (S154), and the global buffer GB may transmit the first data to the external device.

That is, the read operation on the first plane PL1 may be performed by the page buffer group PBG1 and the column selection decoder CS_DEC1 coupled to the first plane PL1, but the outputting of the converted data may be performed by the page buffer group PBG2 and the column selection decoder CS_DEC2 coupled to the second plane PL2.

Figure 16:
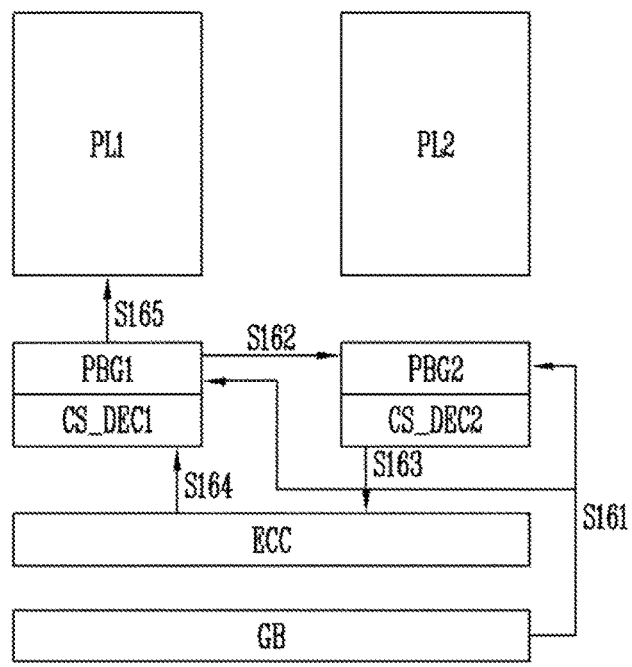
FIG. 16 is a diagram illustrating a program operation according to an embodiment of the present invention.
Figure 17:
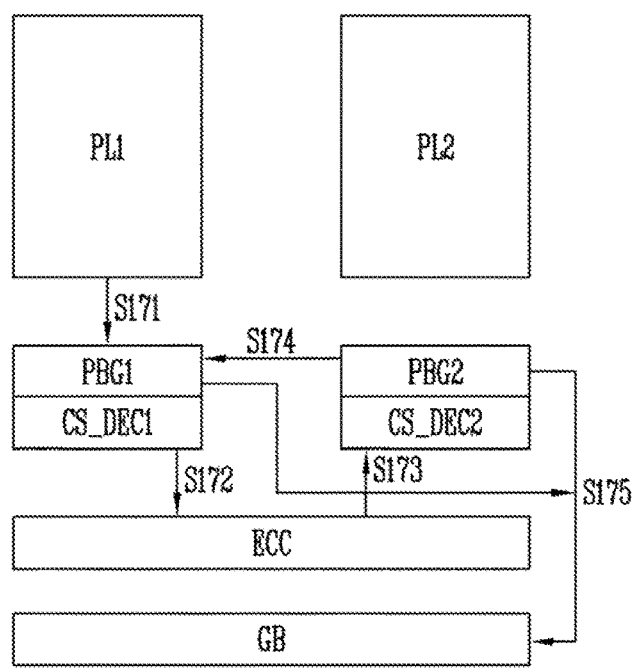
FIG. 17 is a diagram Illustrating a read operation according to an embodiment of the present invention.

FIGS. 16 and 17 are diagrams illustrating other embodiments of the program operation and the read operation described with reference to FIGS. 14 and 15.

FIG. 16 is a diagram illustrating a program operation according to an embodiment of the present invention.

Referring to FIG. 16, when the first data is received from the external device in the global buffer GB, the global buffer GB may transmit a portion of the first data to a page buffer group PGB1 coupled to the first plane PL1, and the remaining first data to the page buffer group PBG2 coupled to the second plane PL2 (S161). For example, when the first data is 32 bytes, 16 byte of the first data may be transmitted to the page buffer group PGB1 coupled to the first plane PL1, and the remaining 16 byte may be transmitted to the page buffer group PBG2 coupled to the second plane PL2. For the convenience of explanation, the data inputted to the page buffer group PBG1 of the first plane PL1 of the first data is referred to as $(1\text{-}1)^{th}$ data, and the data inputted to the page buffer group PBG2 of the second plane PL2 is referred to as $(1-2)^{th}$ data. That is, when the $(1-1)^{th}$ data and the $(1-2)^{th}$ data are combined, the first data may be obtained. The $(1-1)^{th}$ data may be inputted to first latches of the page buffer group PBG1 coupled to the first plane PL1 and the $(1-2)^{th}$ data may be inputted to first latches of the page buffer group PBG2 coupled to the second plane PL2.

The $(1-1)^{th}$ data may be transmitted to the page buffer group PBG2 coupled to the second plane PL2 (S162). For example, in the page buffer group PBG2 coupled to the second plane PL2, the $(1-2)^{th}$ data may be transmitted from the first latches to second latches, and the $(1-1)^{th}$ data input to the first latches of the buffer group PBG1 coupled to the first plane PL1 may be transmitted to the first latches of the page buffer group PBG2 coupled to the second plane PL2.

After the $(1-2)^{th}$ data input to the second latches of the page buffer group PBG2 is transmitted to the error correction circuit ECC (S163), the $(1-1)^{th}$ data input to the first latches may be transmitted the second latches of the page buffer group PBG2.

The error correction circuit ECC may perform the randomization operation using the seed data to convert the $(1-2)^{th}$ data into $(2-2)^{th}$ data and generate first parity data for the $(2-2)^{th}$ data.

The $(2-2)^{th}$ data and the first parity data may be transmitted to the page buffer group PBG1 coupled to the first plane PL1 (S164). For example, the $(2-2)^{th}$ data may be transmitted to the main page buffer group M_PBG of the page buffer group PBG1, and the first parity data may be transmitted to the spare page buffer group S_PBG of the page buffer group PBG1. For example, the $(2-2)^{th}$ data may be inputted the second latches of the page buffers.

When the $(2-2)^{th}$ data and the first parity data are transmitted to the page buffer group PBG1, the $(1-1)^{th}$ data input to the second latches of the page buffer group PBG2 coupled to the second plane PL2 may be transmitted to the error correction circuit ECC.

The error correction circuit ECC may perform the randomization operation using the seed data to convert the $(1-1)^{th}$ data into $(2-1)^{th}$ data and generate second parity data for the $(2-1)^{th}$ data. The $(2-2)^{th}$ data input to the second latches of the page buffer group PBG1 may be transmitted to third latches included in the same page buffers.

The $(2-2)^{th}$ data input to the third latches of the page buffer group PBG1 may be programmed to the selected page of the selected memory block of the first plane PL1 (S165). The error correction circuit ECC may transmit the $(2-1)^{th}$ data and the second parity data to the page buffer group PBG1 coupled to the first plane PL1. For example, the $(2-1)^{th}$ data may be inputted the second latches of the page buffers. When the program operation on the $(2-2)^{th}$ data is completed, the program operation on the $(2-1)^{th}$ data may be performed.

The data programmed in the selected page of the selected memory block of the first plane P1 may be read in the reverse order to the program operation described above. The read operation will be described in more detail as below.

FIG. 17 is a diagram illustrating a read operation according to an embodiment of the present invention.

Referring to FIG. 17, the first plane PL1 may be read and the $(2-2)^{th}$ data may be inputted the page buffer group PBG1 (S171). The $(2-1)^{th}$ data programmed in the first plane PL1 may not be read.

When the $(2-2)^{th}$ data inputted to the page buffer group PBG1 and the first parity data stored in the spare page buffer group S_PBG are transmitted to the error correction circuit ECC (S172), the remaining $(2-1)^{th}$ data may be read and input to the page buffer group PBG1.

The error correction circuit ECC may determine whether or not there is an error in the $(2-2)^{th}$ data by using the first parity data, correct the error when there is the error, and perform the de-randomization operation using the seed data, so that the $(2-2)^{th}$ data may be converted into the $(1-2)^{th}$ data. The $(1-2)^{th}$ data may be transmitted to the page buffer group PBG2 coupled to the second plane PL2 (S173).

The remaining $(2-1)^{th}$ data inputted to the page buffer group PBG1 and the second parity data stored in the spare page buffer group S_PBG may be transmitted to the error correction circuit ECC. The error correction circuit ECC may determine whether there is an error in the (2-1) data by using the second parity data, correct the error when there is the error, and perform the de-randomization operation using the seed data, so that the $(1-1)^{th}$ data may be transmitted to the page buffer group PBG2 coupled to the second plane PL2. The page buffer group PBG2 may transmit the $(1-1)^{th}$ data to the page buffer group PBG1 coupled to the first plane PL1 (S174).

The $(1-1)^{th}$ data and the $(1-2)^{th}$ data stored in the page buffer groups PBG1 and PBG2 may be sequentially transmitted to the external device through the global buffer GB (S175).

As described above, the numbers of column selection decoders and the column selection control circuits may be reduced by using the page buffer groups coupled to the different planes, thereby reducing a size of the semiconductor memory device. Further, since the parity data used during the error correction operation is stored in the page buffers, an additional register for storing the parity data may not be required. As a result, the size of the semiconductor memory device may be further reduced.

Figure 18:
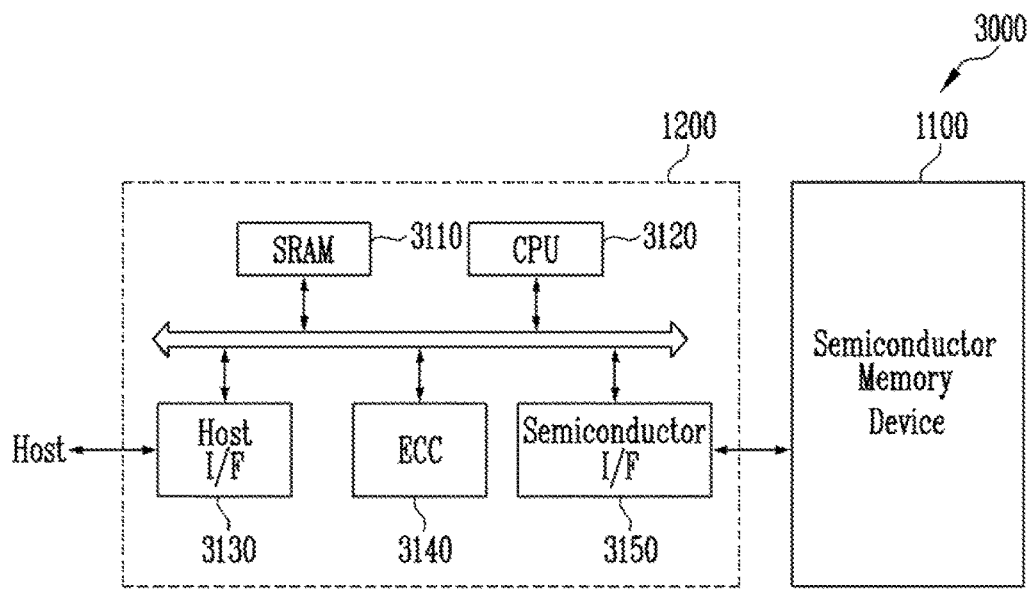
FIG. 18 is a diagram illustrating a memory system according to an embodiment of the present invention.

FIG. 18 is a diagram illustrating a memory system 3000 according to an embodiment of the present invention.

Referring to FIG. 18, the memory system 3000 may include a semiconductor memory device 1100 storing data, and a memory controller 1200 for controlling the semiconductor memory device 1100 according to control of a host. The memory device 1100 and the memory controller 1200 of FIG. 18 may have substantially identical with the semiconductor memory device 1100 and the memory controller 1200 of the memory system 1000 shown in FIG. 1, and described in FIGS. 2 to 17.

The memory controller 1200 may include a static random access memory (SRAM) 3110, a central processing unit (CPU) 3120, a host interface 3130, an error correction circuit (ECC) 3140, and a semiconductor interface 3150 to control the semiconductor memory device 1100, all operatively coupled via a bus. The SRAM 3110 may be used as a working memory of the CPU 3120. The host interface 3130 may include a data exchange protocol compatible with the host which is coupled to the memory system 3000. The error correction circuit 3140 provided in the memory controller 1200 may detect and correct errors included in the data read from the semiconductor memory device 1100. The semiconductor interface 3150 may interface with semiconductor memory device 1100. The CPU 3120 may perform a control operation for exchanging data with the memory controller 1200. Although not shown in FIG. 18, the memory system 3000 may be further provided with a ROM (not shown) or the like for storing code data for interfacing with the host.

The memory controller 1200 may select a memory block or a sub-memory block included in the semiconductor memory device 1100 according to the amount of data loaded during the program operation. The semiconductor memory device 1100 may be controlled so that the program operation may be performed on the selected memory block. For example, the information of the main memory block and the sub-memory block classified according to a storage capacity may be stored in the SRAM 3110. The CPU 3120 may control the semiconductor memory device 1100 so that the main memory block or the sub-memory block is selected according to the amount of data loaded from the host and the information of the memory blocks stored in the SRAM 3110. Alternatively, the CPU 3120 may set the storage capacity of the sub-memory block according to the loaded data and control the semiconductor memory device 1100 so that the program operation may be performed on the set sub-memory block.

The memory system 3000 according to the present invention may be applied to a computer, an ultra mobile PC (UMPC), a workstation, a netbook, a PDA, a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving information in a wireless environment, and one of various devices constituting a home network.

Figure 19:
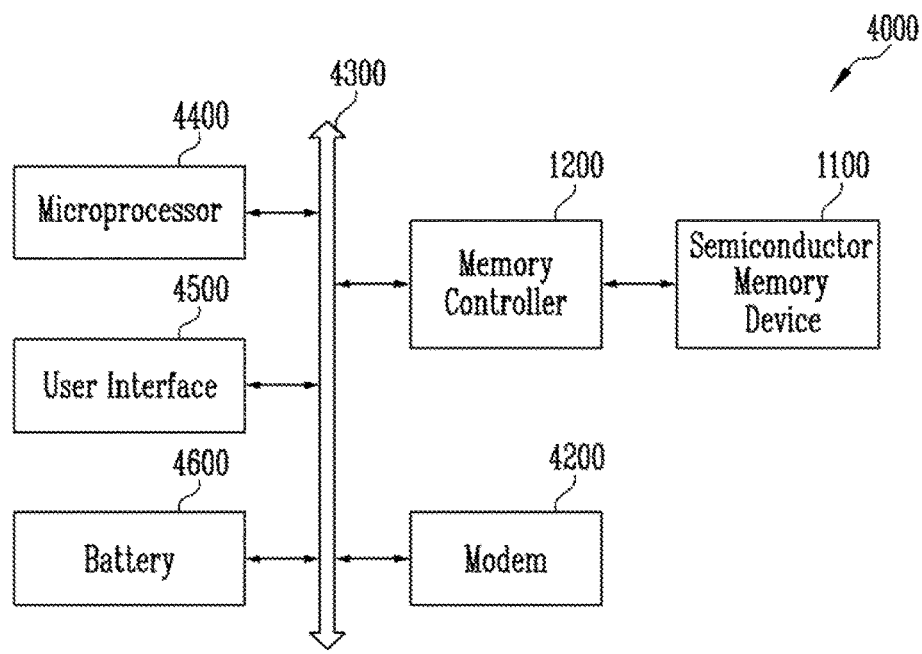
FIG. 19 is a diagram illustrating a computing system according to an embodiment of the present invention.

FIG. 19 is a diagram illustrating a computing system 4000 according to an embodiment of the present invention.

Referring to FIG. 19, the computing system 4000 according to the present invention may include a semiconductor memory device 1100 electrically coupled to a memory controller 1200. The memory controller 1200 may be coupled to a modem 4200, a microprocessor 4400, and a user interface 4500 via a bus 4300. When the computing system 4000 according to the present invention is a mobile device, a battery 4600 for supplying an operation voltage of the computing system 4000 may be additionally provided. Although not shown in FIG. 19, the computing system 4000 according to the present invention may further include an application chip set, a camera image processor (CIS), and a mobile dynamic random access memory (DRAM).

Since the semiconductor memory device 1100 and the memory controller 1200 of FIG. 19 may be configured substantially the same as those of FIG. 1, a detailed description of the semiconductor memory device 1100 will be omitted.

The memory controller 1200 and the semiconductor memory device 1100 may constitute a solid state drive/disk (SSD).

A system according to the present invention may be embodied by using various types of packages. For example, the system according to the present invention may be embodied by using such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a system in package (SIP), a multichip package (MCP), a wafer-level fabricated package (WFP) and a wafer-level processed stack package (WSP), and the like.

According to the present invention, the size of the semiconductor memory device may be reduced by temporarily storing the parity data required for an error correction operation in the page buffers.

While the invention has been described in connection with what is presently considered to be the most practical and preferred embodiment, it is to be understood that the invention is not limited to the disclosed embodiments. It will be apparent to those skilled in the art that various modifications and variations can be made in the present invention without departing from the spirit or scope of the present Invention.

What is claimed is:

1. A semiconductor memory device comprising:
a plurality of planes including a plurality of memory cells;
read/write circuits coupled to the plurality of planes, respectively, and temporarily storing normal data inputted from an external device, random data, and parity data; and
an error correction circuit generating the random data by randomizing the normal data, generating parity data for the random data during a program operation, correcting an error of the random data by using the parity data and de-randomizing the random data during a read operation,
wherein the read/write circuits comprise:
first latches temporarily storing the normal data input from the external device or outputting the normal data de-randomized from the random data to the external device;
second latches exchanging the random data or the normal data de-randomized from the random data, with the error correction circuit; and
third latches exchanging data with selected memory cells during the program operation or the read operation.

2. The semiconductor memory device according to claim 1, wherein the planes comprise a plurality of memory blocks including a plurality of pages.

3. The semiconductor memory device according to claim 1, wherein the read/write circuits comprise:
a main page buffer group temporarily storing the normal data or the random data and performing the program operation or the read operation on a selected page by using the random data;
a spare page buffer group storing the parity data;
a repair page buffer group temporarily storing repair data and performing the program operation or the read operation on the selected page by using the repair data;
column selection decoders generating column selection signals for transmitting the normal data, the parity data or the random data between the main page buffer group, the spare page buffer group or the repair page buffer group and the error correction circuit; and
a column selection control circuit controlling the column selection decoders in response to a column address.

4. The semiconductor memory device according to claim 3, wherein the main page buffer group includes a plurality of main page buffers,
the spare page buffer group includes a plurality of spare page buffers, and
the repair page buffer group includes a plurality of repair page buffers.

5. The semiconductor memory device according to claim 4, wherein the main page buffers, the spare page buffers, and the repair page buffers comprise the first latches the second latches and the third latches.

6. The semiconductor memory device according to claim 5, wherein the first latches receive the normal data from the external device or output the normal data to the external device, through a global buffer.

7. The semiconductor memory device according to claim 5, wherein the second latches receive or transmit the random data or the normal data through a global data line in response to the column selection signals.

8. The semiconductor memory device according to claim 5, wherein the third latches are coupled to the memory cells through bit lines.

9. The semiconductor memory device according to claim 3, wherein the column selection decoders control the main page buffer group, the spare page buffer group, and the repair page buffer group so that
data stored in the main page buffer group, the spare page buffer group, or the repair page buffer group is transmitted to the error correction circuit through a global data line, or
data input to the error correction circuit is transmitted to the main page buffer group, the spare page buffer group, or the repair page buffer group through the global data line.

10. The semiconductor memory device according to claim 1, wherein the read/write circuits transmit data in a selected plane among the planes, or transmit the data between different planes.

11. A semiconductor memory device comprising:
a plurality of memory blocks including a plurality of memory cells;
a page buffer group coupled to the plurality of memory blocks through bit lines and temporarily storing first data, second data randomized from the first data, or parity data;
a first column selection decoder sequentially transmitting the first data, the second data, or the parity data stored in the page buffer group to a first global data line;
a second column selection decoder sequentially inputting the first data, the second data, or the parity data loaded on a second global data line to the page buffer group; and
an error correction circuit coupled to the page buffer group through the first and second global data lines, randomizing the first data to convert the first data into the second data, generating the parity data, correcting an error of the second data by using the parity data, and de-randomizing the second data to convert the second data into the first data,
wherein the page buffer group comprises:
first latches temporarily storing the first data input from an external device or outputting the second data to the external device;
second latches exchanging the first or second data with the error correction circuit; and
third latches exchanging data with selected memory cells during a program operation or a read operation.

12. The semiconductor memory device according to claim 11, wherein the page buffer group comprises:
a main page buffer group storing normal data included in the first or second data; and
a repair page buffer group storing repair data in replacement of a defective bit line of the main page buffer group.

13. The semiconductor memory device according to claim 12, wherein the main page buffer group and the repair page buffer group include a plurality of latches storing data.

14. The semiconductor memory device according to claim 13, wherein the latches comprise the first latches, the second latches and the third latches.

15. The semiconductor memory device according to claim 14, wherein the first column selection decoder controls the page buffer group such that the first or second data input to the second latches is transmitted to the first global data line.

16. The semiconductor memory device according to claim 14, wherein the second column select decoder controls the page buffer group such that the first or second data loaded on the second global data line is transmitted to the second latches.

17. The semiconductor memory device according to claim 11, wherein the error correction circuit generates the parity data for performing an error correction operation on the second data.

18. The semiconductor memory device according to claim 12, wherein the page buffer group further includes:
a spare page buffer group for storing the parity data generated in the error correction circuit.

19. A semiconductor memory device comprising:
a plurality of planes including a plurality of memory blocks;
page buffer groups coupled to the plurality of planes, respectively, and temporarily storing first data, second data randomized from the first data, or parity data used for an error correction operation;
column selection decoders sequentially transmitting the first data, the second data or the parity data stored in the page buffer groups to global data lines, or sequentially transmitting data loaded on the global data lines to the page buffer groups;
an error correction circuit coupled to the page buffer groups through the global data lines, randomizing the first data to convert the first data into the second data, generating the parity data for the second data, performing the error correction operation, and de-randomizing the second data to convert the second data into the first data; and
a global buffer transmitting data between the page buffer groups,
wherein the page buffer groups comprise:
first latches temporarily storing the first data input from an external device or outputting the second data to the external device;
second latches exchanging the first or second data with the error correction circuit; and
third latches exchanging data with selected memory cells during a program operation or a read operation.

20. The semiconductor memory device according to claim 19, wherein the page buffer groups comprise:
main page buffer groups storing normal data included in the first or second data; and
repair page buffer groups storing repair data in replacement of defective bit lines of the main page buffer groups.

21. The semiconductor memory device according to claim 20, wherein the main page buffer groups and the repair page buffer groups include a plurality of latches storing data.

22. The semiconductor memory device according to claim 21, wherein the latches comprise the first latches, the second latches and the third latches.

23. The semiconductor memory device according to claim 19, wherein the error correction circuit generates the parity data for performing the error correction operation on the second data.

24. The semiconductor memory device according to claim 23, wherein the page buffer groups further include:
spare page buffer groups for storing the parity data generated in the error correction circuit.

25. The semiconductor memory device according to claim 19, wherein the global buffer exchanges data between an external device and the page buffer groups, or exchange the first data, the second data, or the parity data between the external device and page buffer groups coupled to a selected plane, among the planes, during a program operation or a read operation on the selected plane.

* * * * *